US011365471B2

(12) United States Patent
Sprague

(10) Patent No.: US 11,365,471 B2
(45) Date of Patent: Jun. 21, 2022

(54) METHOD OF FABRICATING ANISOTROPIC OPTICAL INTERFERENCE FILTER

(71) Applicant: Materion Corporation, Mayfield Heights, OH (US)

(72) Inventor: Robert Sprague, Acton, MA (US)

(73) Assignee: Materion Corporation, Mayfield Heights, OH (US)

( * ) Notice: Subject to any disclaimer, the term of this patent is extended or adjusted under 35 U.S.C. 154(b) by 30 days.

(21) Appl. No.: 16/709,426

(22) Filed: Dec. 10, 2019

(65) Prior Publication Data

US 2020/0116911 A1  Apr. 16, 2020

Related U.S. Application Data

(63) Continuation of application No. 15/797,894, filed on Oct. 30, 2017, now Pat. No. 10,502,880, which is a continuation of application No. 15/046,167, filed on Feb. 17, 2016, now Pat. No. 9,804,310.

(60) Provisional application No. 62/117,122, filed on Feb. 17, 2015.

(51) Int. Cl.
  *C23C 14/04* (2006.01)
  *G02B 5/28* (2006.01)

(52) U.S. Cl.
  CPC ............ *C23C 14/044* (2013.01); *G02B 5/285* (2013.01)

(58) Field of Classification Search
  CPC .................................................. C23C 14/044
  See application file for complete search history.

(56) References Cited

U.S. PATENT DOCUMENTS

| 4,050,811 A * | 9/1977 | Russell .................. G11B 7/28 355/46 |
| 4,303,489 A * | 12/1981 | Morrison, Jr. ........ C23C 14/044 204/192.12 |
| 5,380,558 A * | 1/1995 | Fujino .................. C23C 14/044 204/192.26 |
| 5,589,042 A | 12/1996 | Robinson et al. |

(Continued)

OTHER PUBLICATIONS

Mcleod et al.; Improving the spectral resolution of wedged etalons and linear variable filters with incidence angle; Optics Letters; Oct. 1, 2005; pp. 2647-2649; vol. 30, No. 19.

(Continued)

*Primary Examiner* — Keath T Chen
(74) *Attorney, Agent, or Firm* — Tucker Ellis LLP

(57) ABSTRACT

In a method of manufacturing a one-dimensionally varying optical filter, a substrate is coated to form a stack of layers of two or more different types. The coating may, for example, employ sputtering, electron-beam evaporation, or thermal evaporation. During the coating, the time-averaged deposition rate is varied along an optical gradient direction by generating reciprocation between a shadow mask and the substrate in a reciprocation direction that is transverse to the optical gradient direction. In some approaches, the shadow mask is periodic with a mask period defined along the direction of reciprocation, and the generated reciprocation has a stroke equal to or greater than the mask period along the direction of reciprocation. The substrate and the shadow mask may also be rotated together as a unit during the coating. Also disclosed are one-dimensionally varying optical filters, such as linear variable filters, made by such methods.

19 Claims, 5 Drawing Sheets

(56) References Cited

U.S. PATENT DOCUMENTS

| | | | | |
|---|---|---|---|---|
| 6,045,671 | A * | 4/2000 | Wu | B82Y 25/00 |
| | | | | 506/40 |
| 6,087,274 | A * | 7/2000 | Tonucci | C03C 17/001 |
| | | | | 216/54 |
| 6,364,956 | B1 * | 4/2002 | Wang | B01J 19/0046 |
| | | | | 118/723 EB |
| 6,475,557 | B1 * | 11/2002 | Mori | B29D 11/00634 |
| | | | | 204/192.11 |
| 2002/0176097 | A1 * | 11/2002 | Rodgers | H01L 21/68764 |
| | | | | 356/630 |
| 2004/0214449 | A1 * | 10/2004 | Yotsuya | C23C 14/12 |
| | | | | 438/742 |
| 2004/0231595 | A1 * | 11/2004 | Takeuchi | C23C 14/28 |
| | | | | 118/721 |
| 2006/0057240 | A1 * | 3/2006 | Koinuma | C23C 14/044 |
| | | | | 425/223 |
| 2007/0248751 | A1 * | 10/2007 | Ling | C23C 14/044 |
| | | | | 427/248.1 |
| 2008/0285165 | A1 | 11/2008 | Wu et al. | |
| 2011/0293835 | A1 * | 12/2011 | Lavi | C23C 14/044 |
| | | | | 427/282 |
| 2013/0186335 | A1 * | 7/2013 | Kawato | C23C 14/12 |
| | | | | 118/720 |
| 2014/0004641 | A1 * | 1/2014 | Sonoda | H01L 51/56 |
| | | | | 438/34 |
| 2015/0240348 | A1 | 8/2015 | Hanihara | |

OTHER PUBLICATIONS

Piegari et al.; Variable narrow-band transmission filters for spectrometry from space. 2. Fabrication process; Applied Optics; May 1, 2008; pp. C151-C156; vol. 47, No. 13.

Abel-Tibérini et al.; Masking mechanisms applied to thin-film coatings for the manufacturing of linear variable filters for two-dimensional array detectors; Applied Optics; Oct. 20, 2008; pp. 5706-5714; vol. 47, No. 30.

Dami et al.; Ultra Compact Spectrometer Using Linear Variable Filters; International Conference on Space Optics; Oct. 4-8, 2010.

* cited by examiner

METHOD OF FABRICATING ANISOTROPIC OPTICAL INTERFERENCE FILTER

This application is a continuation of U.S. Ser. No. 15/797,894 filed Oct. 30, 2017, which issued as U.S. Pat. No. 10,502,880 on Dec. 10, 2019, which is a continuation of U.S. Ser. No. 15/046,167, filed Feb. 17, 2016, which issued as U.S. Pat. No. 9,804,310 on Oct. 31, 2017, which claims the benefit of U.S. Provisional Application No. 62/117,122 filed Feb. 17, 2015 and titled "METHOD OF FABRICATING ANISOTROPIC OPTICAL INTERFERENCE FILTER". U.S. Provisional Application No. 62/117,122 filed Feb. 17, 2015 is incorporated herein by reference in its entirety.

BACKGROUND

The following relates to the optical arts, optical filter arts, and related arts.

Optical filters with high spectral selectivity can be manufactured using a stack of layers with alternating layers of two (or more) constituent materials having different refractive index values. Such filters are sometimes called interference filters, and can be designed and variously combined to provide a designed pass-band, stop-band, high-pass, or low-pass output. A notch filter can be designed by constructing the stack of layers to form a Bragg reflector blocking a stop-band. The layer stack is deposited on a substrate that is optically transmissive for the wavelength or wavelength range to be transmitted, and may for example be a glass plate for an optical filter in the visible spectrum.

A linear variable filter is similar, but includes a linear gradient in the thickness(es) of one or more layers of the interference filter. The linear gradient produces a corresponding linear gradient in the wavelength (e.g. passband), though the correspondence is not necessarily linear in nature.

Some improvements are disclosed herein.

BRIEF SUMMARY

In one illustrative aspect, a method of manufacturing a one-dimensionally varying optical filter is disclosed. The method comprises: providing a shadow mask having an opening fraction along a direction of reciprocation that varies along a direction transverse to the direction of reciprocation; coating a substrate through the shadow mask to form a stack of layers of two or more different types; and during the coating, generating reciprocation between the shadow mask and the substrate in the direction of reciprocation. Also disclosed is a one-dimensionally varying optical filter manufactured by the foregoing method.

In another illustrative aspect, a method of manufacturing a one-dimensionally varying optical filter is disclosed. The method comprises: coating a substrate through a shadow mask to form a stack of layers of two or more different types; and, during the coating, generating reciprocation between the shadow mask and the substrate. The shadow mask has openings configured to, in combination with the generated reciprocation, define a coating duty cycle that varies along a direction transverse to the direction of reciprocation. Also disclosed is a linear variable filter manufactured by the foregoing method.

In another illustrative aspect, a method of manufacturing a one-dimensionally varying optical filter is disclosed. The method comprises coating a substrate to form a stack of layers of two or more different types and, during the coating, varying the time-averaged deposition rate along an optical gradient direction by generating reciprocation between a shadow mask and the substrate in a reciprocation direction that is transverse to the optical gradient direction. In some embodiments the shadow mask is periodic with a mask period defined along the direction of reciprocation, and the generated reciprocation has a stroke equal to or greater than the mask period along the direction of reciprocation.

In another illustrative aspect, a method of manufacturing a one-dimensionally varying optical filter is disclosed. The method comprises: providing a shadow mask having openings; coating a substrate through the shadow mask to form a stack of layers of two or more different types; and during the coating, generating reciprocation between the shadow mask and the substrate in the direction of reciprocation. The duty cycle of the reciprocating is varied during the coating in order to produce a multiplicity of filters having similar profiles but differing wavelength characteristics via a single deposition. In some embodiments, the openings of the shadow mask do not have an opening fraction along a direction of reciprocation that varies along a direction transverse to the direction of reciprocation.

DETAILED DESCRIPTION

Figure 1:
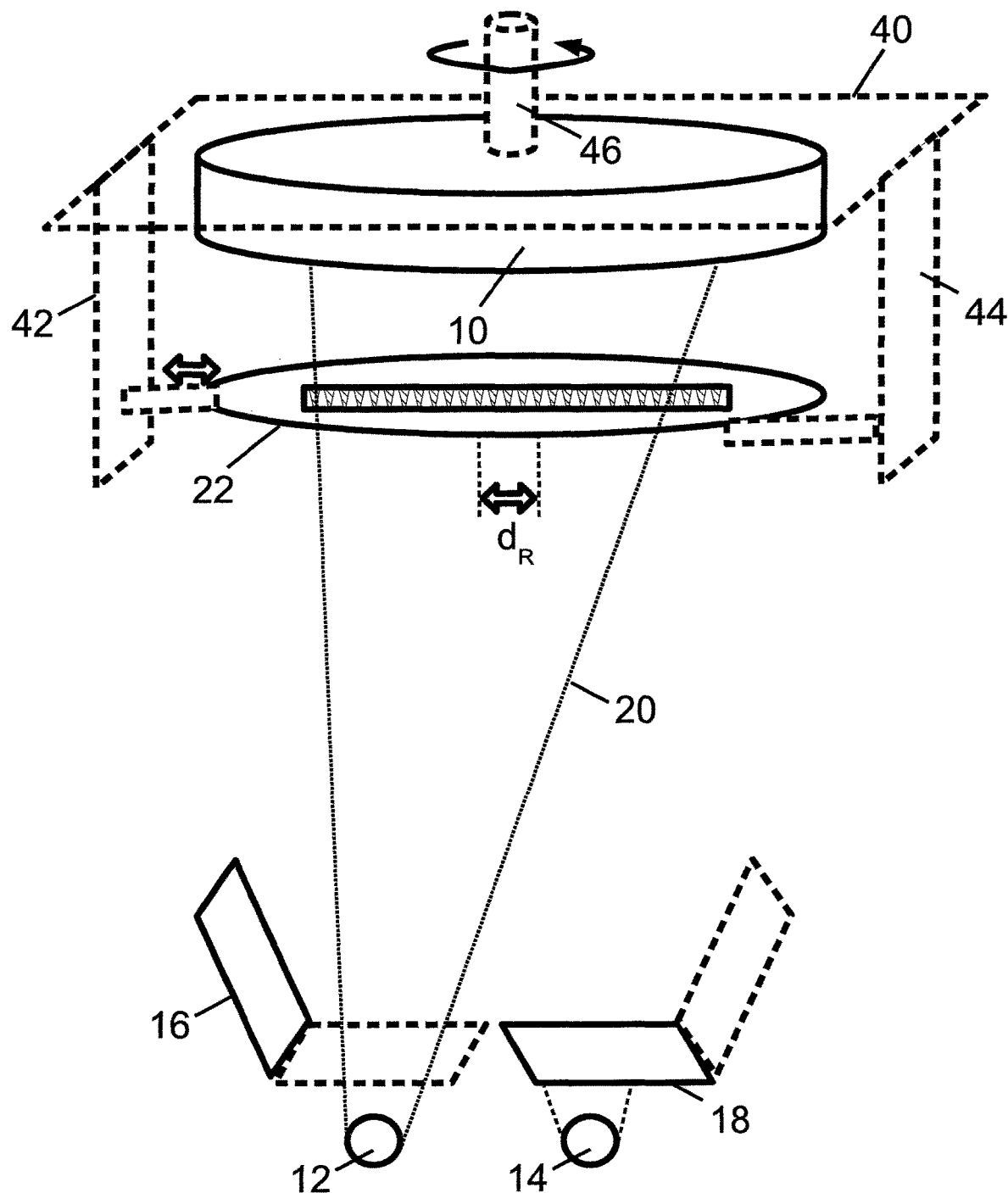
FIG. 1 diagrammatically represents a linear variable filter deposition system as disclosed herein.

With reference to FIG. 1, a one-dimensionally varying filter manufacturing system deposits a one-dimensionally varying filter on a substrate 10 includes an illustrative two coating material sources 12, 14 controlled by respective shutters 16, 18. At the illustrative point in time shown in FIG. 1, shutter 16 is open allowing a deposition beam 20 from the coating material source 12 to impinge upon the substrate 10 through a shadow mask wafer 22, while the shutter 18 is closed thus blocking deposition from the coating material source 14. It will be appreciated that deposition by coating material source 14 can be performed by closing shutter 16 and opening shutter 18 (configuration shown in phantom in FIG. 1), or that both shutters 16, 18 could be opened to co-deposit using both coating material sources 12, 14. The illustrative coating sources 12, 14 can be thermal evaporation sources heated by a heat source such as a resistive heater or an electron beam, or sputtering sources in which energetic particles ejects material from a sputtering target, various combinations thereof, or so forth. While two illustrative coating sources 12, 14 are shown, a multiplicity of sources could be employed to overcome various limitations inherent in the individual sources or in the fabrication of layers with complex compositions such as ternary alloys, which in some embodiments may include continuously varying compositions (i.e. compositional grading) over the thickness of a layer.

Figure 2:
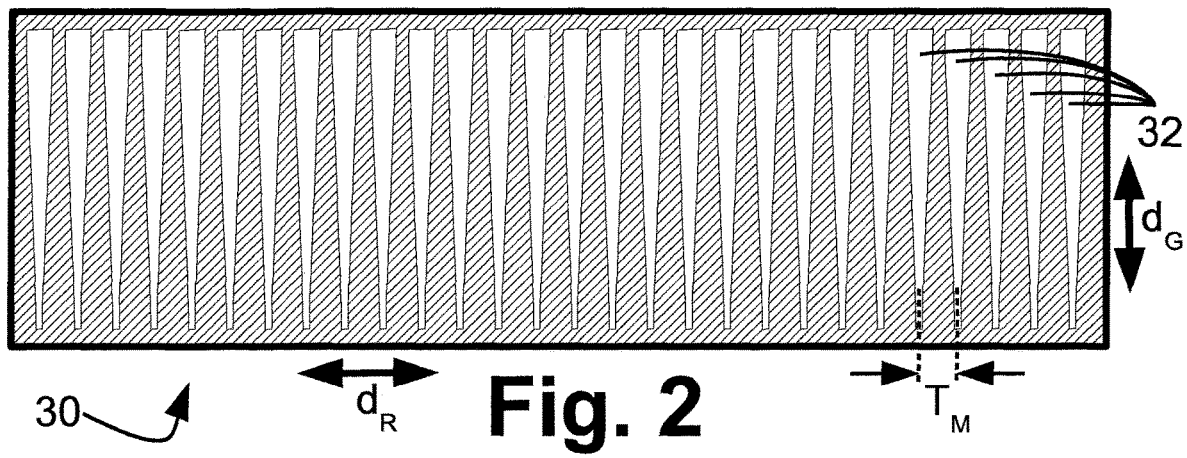
FIG. 2 diagrammatically shows a plan view of a shadow mask suitably used in the system of FIG. 1 in generating one linear variable filter.

With continuing reference to FIG. 1 and with further reference to FIG. 2, the shadow mask wafer 22 includes a shadow mask 30 comprising a one-dimensional array of wedge-shaped openings 32 along a direction of reciprocation ($d_R$), with each wedge extending from a narrow end to a wide end along a direction ($d_G$) transverse to the direction of reciprocation $d_R$. The shadow mask wafer 22 is arranged to reciprocate respective to the substrate 10 in the direction of reciprocation $d_R$ during the coating of the layers making up the interference filter. In diagrammatic FIG. 1, the substrate 10 is mounted on a substrate holder 40, and a reciprocation mechanism includes an actuator arm 42 extending from the substrate holder 40 to connect with and reciprocate the shadow mask wafer 22. A support arm 44 supports the end of the shadow mask wafer 22 distal from its connection with the actuator arm 42. Note that the features 40, 42, 44 are shown in phantom (using dashed lines) to reveal otherwise-occluded features.

In the system of illustrative FIG. 1, the substrate 10 and shadow mask wafer 22 are rotated together as a unit by rotating the substrate holder 40 about a shaft 46. The rotation is optional, but if provided can enhance uniformity of deposition, especially if the coating material sources 12, 14 are located off-center. If rotation is provided, the substrate and shadow mask should rotate together as a unit. It is further contemplated that this entire system may rotate about a second axis in a so-called planetary configuration wherein the device as shown in FIG. 1 constitutes one of the planets.

It is to be appreciated that the illustrative substrate holder and reciprocation mechanism 40, 42, 44 is a diagrammatic representation, and various mechanisms can be employed to generate the reciprocation between the shadow mask 22 and the substrate 10 in the direction of reciprocation $d_R$. In the illustrative embodiment the shadow mask 22 reciprocates while the substrate 10 does not reciprocate; however, in other contemplated embodiments the reciprocation is generated by reciprocating the substrate while the shadow mask does not reciprocate. In embodiments that include rotation of the substrate/shadow mask unit, it is contemplated to use suitable gearing to convert rotary motion to generate the reciprocation of the shadow mask or the substrate.

It will also be appreciated that the deposition system of FIG. 1 may be disposed in a vacuum chamber or other chamber providing controlled ambient composition and pressure. Various other conventional features may be included which are not shown in diagrammatic FIG. 1, such as a substrate heater to control substrate temperature during deposition, a deposition monitoring sensor to measure deposition rate optically or by another mechanism, beam flux sensors to measure the flux of the deposition beam 20, and so forth.

Figure 3:
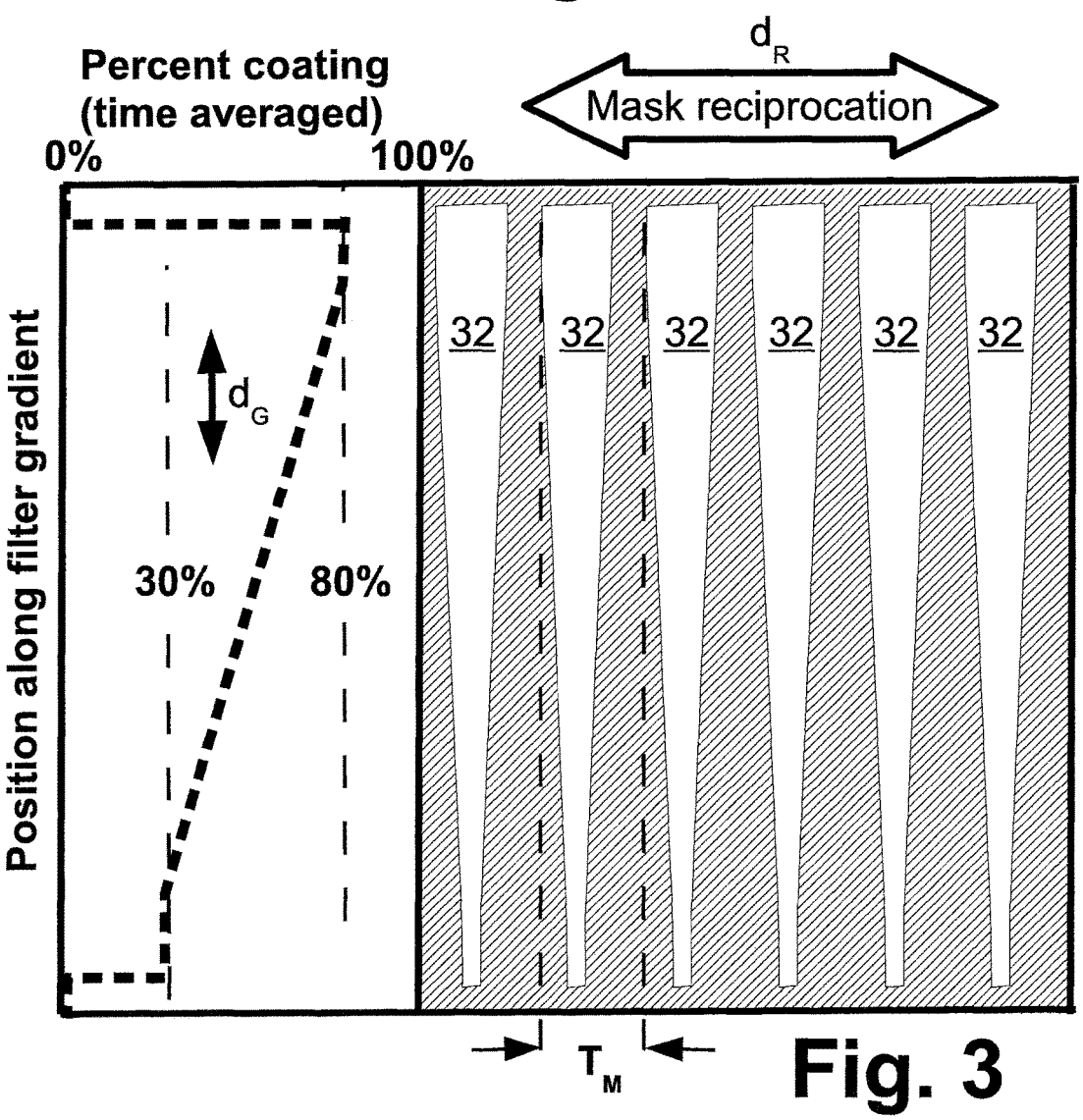
FIG. 3 (right side) diagrammatically shows a portion of the shadow mask of FIG. 2, while FIG. 3 (left side) plots the time-averaged percent coating time provided by the shadow mask operating in the deposition system of FIG. 1.

With continuing reference to FIGS. 1 and 2 and with further reference to FIG. 3, the effect of reciprocation between the shadow mask 22 and the substrate 10 in the reciprocation direction $d_R$ is to vary the time-averaged deposition rate along the optical gradient direction $d_G$, so that the deposited layers exhibit a thickness gradient along the optical gradient direction $d_G$. As already mentioned, the shadow mask 30 comprises a one-dimensional array of wedge-shaped openings 32 along the direction of reciprocation $d_R$, with each wedge extending from a narrow end to a wide end along the (optical gradient) direction $d_G$ transverse to the direction of reciprocation $d_R$. The one-dimensional array of wedge-shaped openings 32 has a period $T_M$ (also referred to herein as the "mask period" $T_M$) along the direction of reciprocation $d_R$. If the stroke of the generated reciprocation is greater than this mask period $T_M$ then, as graphically depicted in FIG. 3, the coating experienced by any point on the substrate 10 is a time-averaged combination of a coating time corresponding to when the point on the substrate is exposed to the deposition beam 20 through one of the wedge-shaped openings 32 and the "blocked" time corresponding to when the point on the substrate is blocked from exposure to the deposition beam 20 by the shadow mask 30. The wedge-shaped openings 32 provide a greater time-averaged exposure for the wide end of the wedge as compared with the narrow end of the wedge. Accordingly, the time-averaged exposure varies gradually from a highest exposure (and hence largest thickness for the deposited layer) at the wide end of the wedge to a lowest exposure (and hense lowest thickness for the deposited layer) at the narrow end of the wedge. This is plotted on the left-hand side of FIG. 3, where in this illustrative example the percent coating (time averaged) ranges from 80% at the wide end of the wedge to 30% at the narrow end of the wedge. This gradient in time-averaged deposition exposure time translates to a corresponding gradient in the deposited layer thickness along the direction $d_G$ transverse to the direction of reciprocation $d_R$—this direction $d_G$ is therefore referred to as the optical gradient direction $d_G$, because in an interference filter the wavelength of the passband (or of the notch in the case of a notch filter) is controlled by the thicknesses of the layers and their respective refractive indices so that the passband (or notch) varies along the optical gradient direction $d_G$ in accord with the varying of layer thicknesses.

Another way of describing this effect is that, during the coating, the reciprocation between the shadow mask and the substrate produces a coating "duty cycle" that varies along the (optical gradient) direction $d_G$ oriented transverse to the direction of reciprocation $d_R$. In FIG. 3, the coating duty cycle is 80% at the thick end of the wedge, and decreases to a coating duty cycle of 30% at the narrow end of the wedge.

Figure 4:
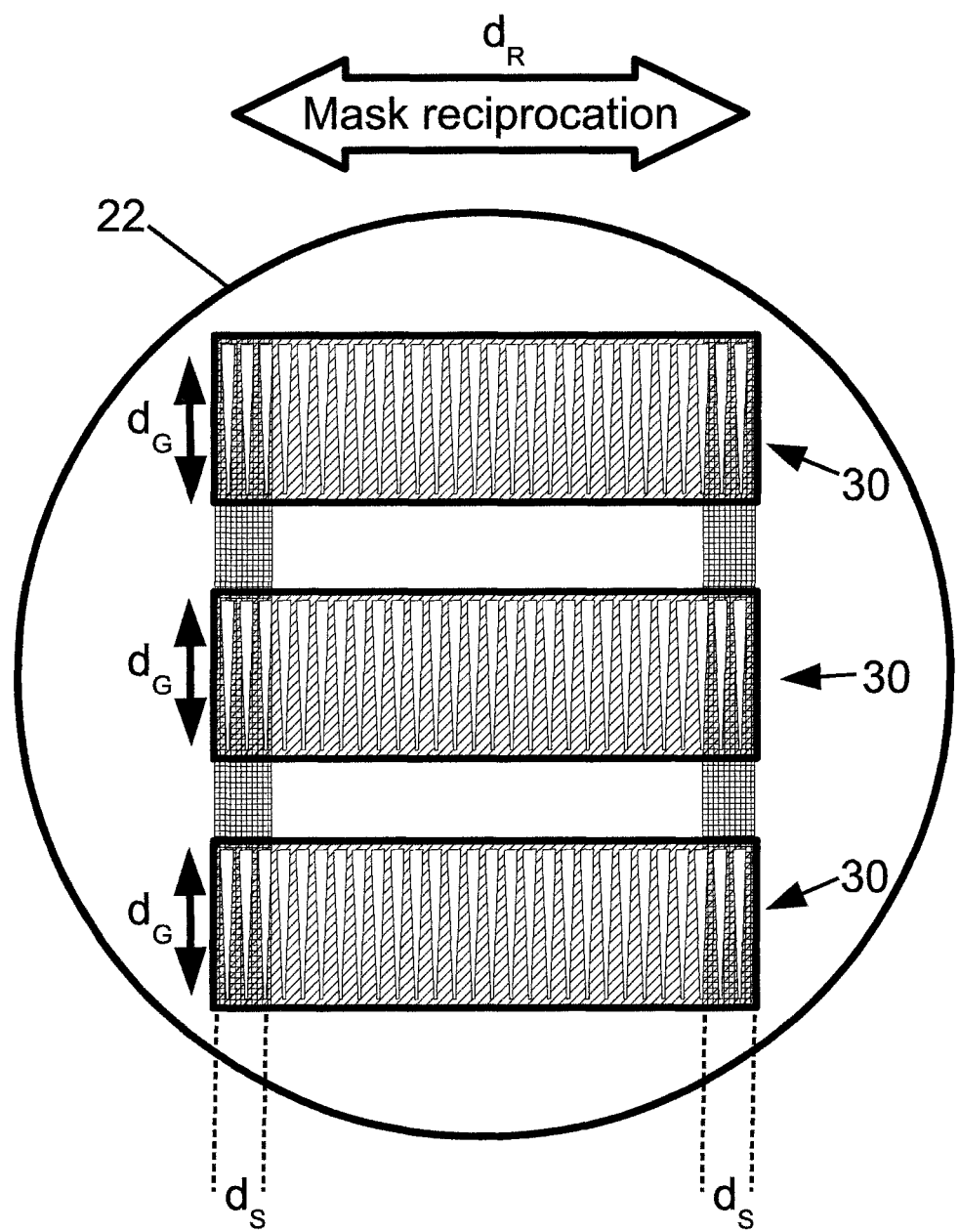
FIG. 4 diagrammatically shows a plan view of a shadow mask wafer suitably used in the system of FIG. 1, in which the shadow mask wafer includes three shadow masks of the type shown in FIG. 2 usable to simultaneously deposit three linear variable filter elements using the system of FIG. 1.

With reference to FIG. 4, it is contemplated to arrange a plurality of shadow masks 30 on the shadow mask wafer 22, e.g. three shadow masks 30 on the shadow mask wafer 22 in the illustrative example of FIG. 4. In FIG. 4 the stroke of the reciprocation is denoted $d_S$, and it will be appreciated that the end portions of the shadow masks 30 of length equal to the stroke $d_S$ will not provide reliable results because during part of the stroke the mask moves "out of range".

Figure 5:
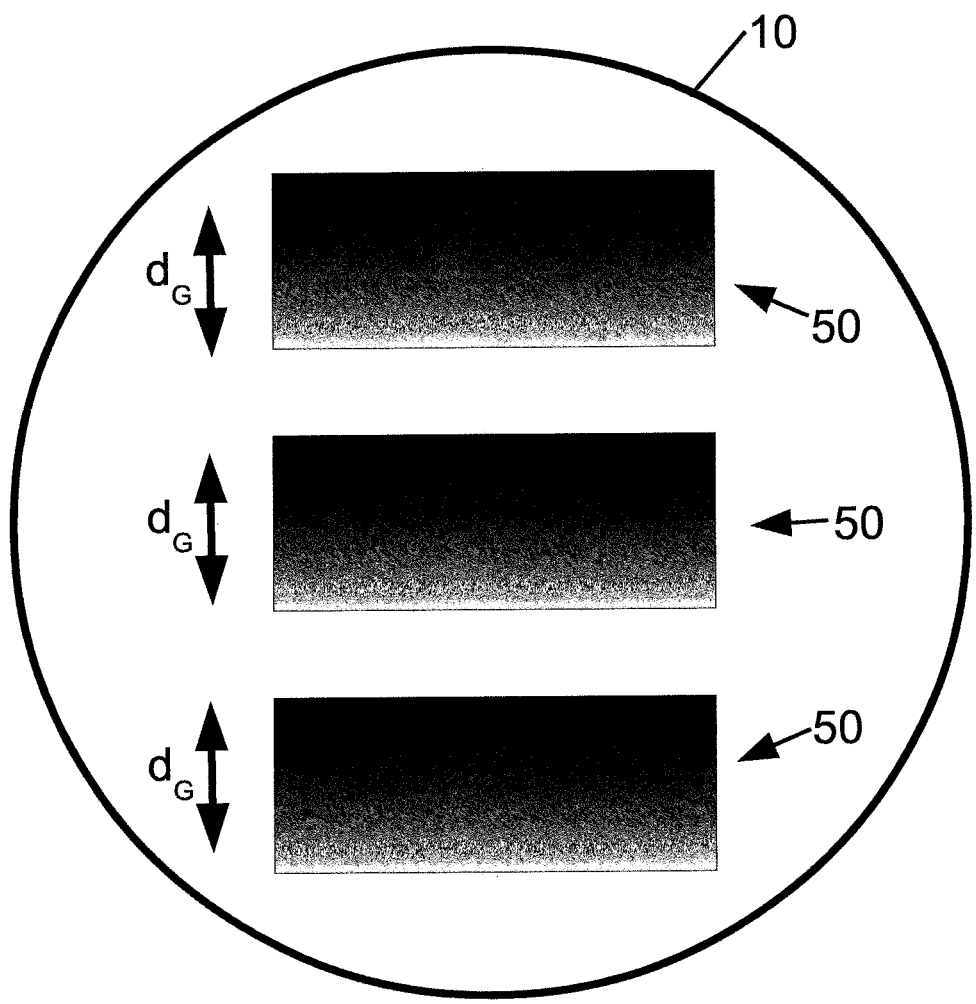
FIG. 5 diagrammatically shows a plan view of a wafer with three linear variable filter elements deposited using the system of FIG. 1 and the shadow mask wafer of FIG. 4.

With continuing reference to FIG. 4 and with further reference to FIG. 5, the three shadow masks 30 of the configuration of the shadow mask wafer 22 shown in FIG. 4 produce a corresponding three interference filters 50 after deposition. As noted in FIG. 5, each interference filter 50 has a thickness gradient (and hence a gradient in its optical bandpass wavelength or optical notch) that varies along the optical gradient direction $d_G$.

In diagrammatic FIG. 1, the separation between the substrate 10 and the shadow mask 22 is relatively large. In general, reducing this separation reduces leakage and provides more precise thickness control, so that the shadow mask is preferably positioned close to the surface of the substrate 10. However, if it is too close there is increased possibility of particulates coming off the shadow mask 22 and contaminating the optical interference filter, so that some finite separation is usually advantageous.

With returning reference to FIG. 1, in a typical interference filter manufacturing sequence, the substrate 10 is loaded into the deposition system, and various preparatory operations are optionally performed such as evacuating the vacuum chamber, backfilling with any desired ambient, turning on a substrate heater to bring the substrate 10 to a desired deposition temperature, and so forth. Both shutters 16, 18 are initially closed, and any preparation of the deposition sources 12, 14 is performed (for example, starting the resistive heaters or electron beams to raise the sources to a temperature at which they produce source material evaporation, or setting up the sputtering beam, et cetera). The reciprocation actuator 42 is started to generate reciprocation between the shadow mask 22 and the substrate 10. Thereafter, the deposition is performed by alternating between the states: (1) shutter 16 open and shutter 18 closed; and (2) shutter 16 closed and shutter 18 open. Each such alternation produces one period of the interference filter, which typically includes (without loss of generality) N periods. The stroke and frequency of the reciprocation is typically held constant throughout the interference filter evaporation—as a consequence, each constituent layer has the same percentage gradient in its thickness over the length of the interference filter in the optical gradient direction $d_G$. For example, referring back to the illustrative example of FIG. 3, if the thickness of a layer "A" deposited by source 12 would be 100 nm in the absence of the shadow mask 30, then layer "A" will vary from 80 nm at the wide end of the wedge to 30 nm at the narrow end of the wedge; while, if the thickness of a layer "B" deposited by source 12 would be 150 nm in the absence of the shadow mask 30, then layer "B" will vary from 120 nm at the wide end of the wedge to 45 nm at the narrow end of the wedge.

It should be noted that the reciprocation can have various characteristics. For example, the reciprocation can be sinusoidal in nature, e.g. moving fastest at the mid-point of the stroke and slowing down to zero velocity at each end of the stroke, which is advantageous from a mechanical reliability/lifetime standpoint. While the detailed stroke timing may affect the effective coating duty cycle, this is suitably accounted for during calibration as described next.

The detailed shape of the openings of the shadow mask 30 can be designed as follows. A calibration shadow mask is made with wedges 32 having straight edges running from very wide to very narrow, and a calibration deposition is performed using this calibration shadow mask and only the deposition source 12 (single layer deposition). The layer thickness is then profiled along the optical gradient direction $d_G$ (for example, using ellipsometry or another optical technique, or mechanical profilometry along the layer edge, or so forth) to determine the time-averaged deposition rate versus coating duty cycle provided by the shadow mask. The same calibration is run for the deposition source 14. (As previously noted, the percentage gradient should be the same for both layers, but the deposition rate may be different, and so it may be advantageous to perform separate calibrations for both sources 12, 14 as just mentioned). In parallel, the interference filter is designed using conventional optical filter design methods thereby providing the desired thickness as a function of position along the optical gradient direction $d_G$. For a linear variable filter, this thickness as a function of position should be linear; more generally, however, the disclosed manufacturing techniques enable fabrication of one-dimensionally varying optical filter in which the thickness may vary non-linearly along the optical gradient direction $d_G$. Given the thickness versus position along the optical gradient direction $d_G$ (from the filter design) and the time-averaged deposition rate versus coating duty cycle provided by the shadow mask calibrations, it is straightforward to design the wedge width along the reciprocation direction $d_R$ as a function of position along the optical gradient direction $d_G$ in order to achieve the target thickness versus position along the optical gradient direction $d_G$.

The illustrative wedge openings 32 of the embodiment of FIGS. 2-4 are one suitable geometry for the openings of the shadow mask. However, other opening designs can be used. In general, the goal is to provide a shadow mask having an opening fraction along the direction of reciprocation $d_R$ that varies along the transverse optical gradient direction $d_G$ with the desired profile. The mask should be periodic with mask period $T_M$ smaller than the reciprocation stroke $d_S$, so that the reciprocation produces time-averaged coating over a reciprocation cycle corresponding to the opening fraction of the mask.

Figure 6:
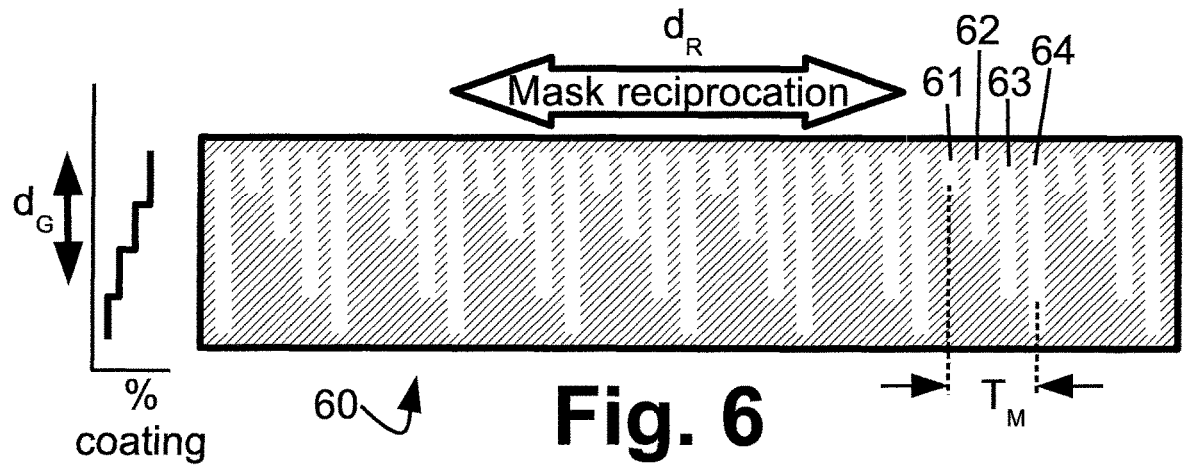
FIGS. 6, 7, and 8 diagrammatically shows plan views of additional shadow masks that may be suitably used in the system of FIG. 1 in generating linear variable filters with different linear gradient profiles.
Figure 7:
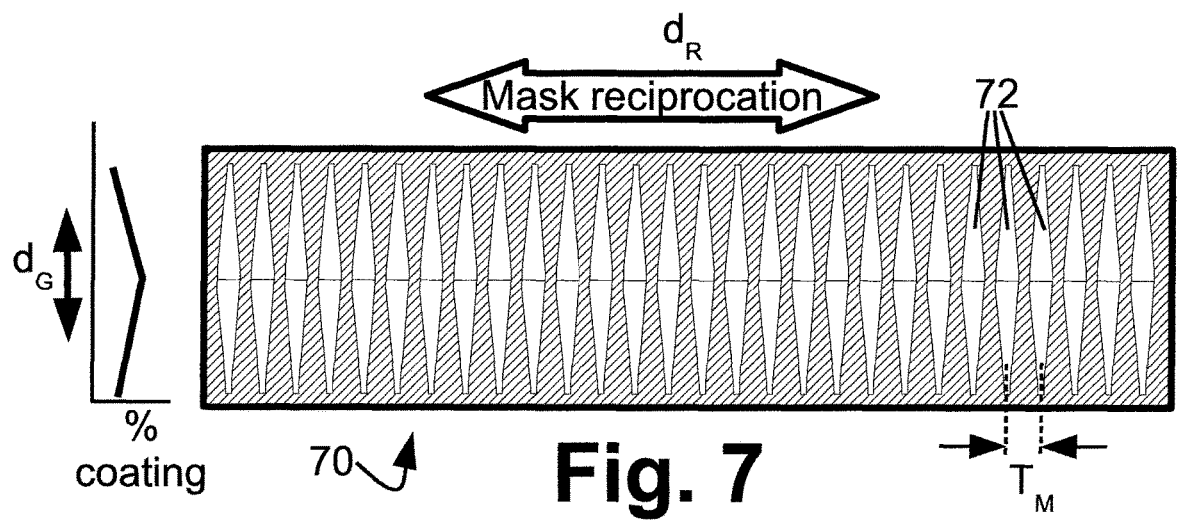
Figure 8:
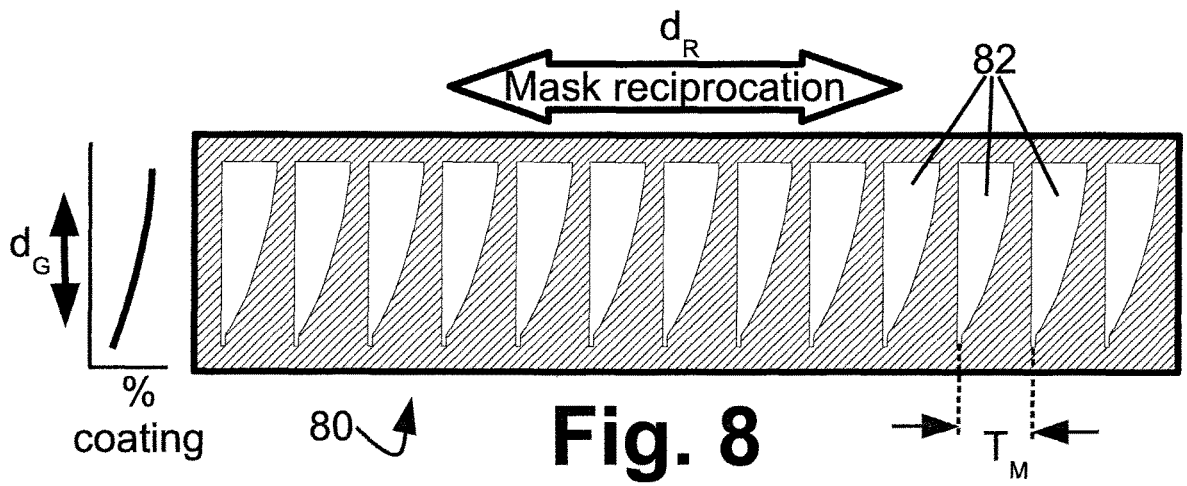

With reference to FIGS. 6-8, some other illustrative shadow masks are shown. In a "digital" shadow mask 60 shown in FIG. 6, openings 61, 62, 63, 64 are each strips oriented along the optical gradient direction $d_G$ of successively longer length, with the longest strip openings 64 extending over most of the shadow mask 60 along the optical gradient direction $d_G$. The resulting coating duty cycle versus position along optical gradient direction $d_G$ is plotted to the left of the shadow mask 60. While the illustrated coating duty cycle exhibits discrete "jumps", these abrupt transitions along the optical gradient direction $d_G$ may be washed out in an actual deposition by spreading of the deposition beam 20 and other factors. While the illustrative digital shadow mask 60 has strip openings 61, 62, 63, 64 of four lengths in the mask period $T_M$, it will be appreciated that strips of more different lengths may be provided to fine-tune the gradient.

With reference to FIG. 7, a shadow mask 70 includes "double-wedge" openings 72 in which the widest part of each wedge meets in the middle of the mask. This results in a thickness versus position profile along the optical gradient direction $d_G$ as shown to the left of the mask 70 in FIG. 7. This illustrates that the thickness-versus-position profile does not need to be monotonic.

With reference to FIG. 8, a shadow mask 80 includes openings 82 which have strongly non-linear right-hand edges, producing a strongly non-linear thickness versus position profile along the optical gradient direction $d_G$ as shown to the left of the mask 80 in FIG. 8.

The illustrative fabrication techniques for manufacturing a one-dimensionally varying optical filter can be used for a wide range of filter types. In the case of transmission filters, the substrate 10 is typically a glass substrate or other substrate of transparent material (at the wavelength range of interest). In an illustrative example, the layers are amorphous silicon and silicon dioxide, although a wide range of dielectric, semiconducting, metal, or other optical-grade materials may be used. The disclosed techniques can also be used to generate reflective interference filters (sometimes referred to as Bragg reflectors)—in this case the substrate may be optically opaque, translucent, or transparent, and the layers may be various materials that, in a stacked arrangement, produce the desired spectrally selective reflection.

In another contemplated approach, the openings of the shadow mask do not include the linear gradient, e.g. the wedge-shaped openings 32 of the shadow mask 30 are replaced by rectangular openings. In such a case, no optical gradient along the optical gradient direction $d_G$ is defined (since there is no variation in the opening "width" along the direction $d_G$ with rectangular openings). However, such a mask can still be useful, for example, by adjusting the duty cycle of the reciprocation in the direction of reciprocation $d_R$ during deposition of successive filters (or filter sections). This has the effect of producing a multiplicity of filters having similar profiles but differing duty cycles and wavelength characteristics fabricated via a single deposition. For example, the first filter in the stack of filters may use a duty cycle giving thicker layers corresponding to a first wavelength, while the second filter may use a duty cycle giving thinner layers corresponding to a second wavelength, and so forth. This duty cycle variation concept can also be used in conjunction with a mask such as the mask 30 of FIG. 1 having wedge-shaped openings or other openings that vary along a direction $d_G$ to produce an optical gradient along direction $d_G$ as well as different layer thicknesses over the height of the layer stack due to variation of the reciprocation duty cycle.

It will be appreciated that various of the above-disclosed and other features and functions, or alternatives thereof, may be desirably combined into many other different systems or applications. It will be further appreciated that various presently unforeseen or unanticipated alternatives, modifications, variations or improvements therein may be subsequently made by those skilled in the art which are also intended to be encompassed by the following claims.

The invention claimed is:

1. A deposition apparatus for depositing a coating material onto an associated substrate, the deposition apparatus comprising:
 a substrate holder configured to hold the associated substrate;
 at least one deposition source arranged to emit a deposition beam onto the associated substrate held by the substrate holder;
 a shadow mask wafer interposed between the at least one deposition source and the substrate holder such that the deposition beam passes through the shadow mask wafer before impinging onto the associated substrate; and
 a reciprocation mechanism configured to generate reciprocation between the shadow mask wafer and the substrate holder in a direction of reciprocation while the at least one deposition source emits the deposition beam to apply the coating material onto the associated substrate to create a one-dimensional varying optical filter, wherein the reciprocation mechanism includes:
 an actuator arm extending from the substrate holder and connecting with and reciprocating the shadow mask wafer,
 a support arm that supports an end of the shadow mask wafer distal from the shadow mask wafer connection with the actuator arm, and
 a rotation mechanism that includes a shaft, wherein the rotation mechanism is configured to rotate the substrate holder and the shadow mask wafer together as a unit about the shaft as the reciprocation mechanism generates the reciprocation.

2. The deposition apparatus of claim 1 wherein the substrate holder and the shadow mask wafer constitute a planet of a planetary configuration, the planetary configuration comprising a plurality of planets and a planetary rotation axis, wherein the plurality of planets is configured to rotate about the planetary rotation axis.

3. The deposition apparatus of claim 1 wherein one of:
 (i) the reciprocation mechanism is configured to generate reciprocation of the shadow mask wafer respective to the substrate holder, or
 (ii) the reciprocation mechanism is configured to generate reciprocation of the substrate holder respective to the shadow mask wafer.

4. The deposition apparatus of claim 1 further comprising:
 a vacuum chamber containing the substrate holder, the shadow mask wafer, and the reciprocation mechanism.

5. The deposition apparatus of claim 1 further comprising:
 a chamber containing the substrate holder, the shadow mask wafer, and the reciprocation mechanism and providing a controlled ambient composition and pressure.

6. The deposition apparatus of claim 1 wherein the at least one deposition source includes at least one thermal evaporation source comprising a resistive heater or an electron beam.

7. The deposition apparatus of claim 1 wherein the at least one deposition source includes at least one sputtering source.

8. The deposition apparatus of claim 1 wherein the substrate holder includes a substrate heater to control temperature of the substrate held by the substrate holder.

9. The deposition apparatus of claim 1 wherein the shadow mask wafer includes or holds at least one shadow mask that has a plurality of openings, each opening having a width in the direction of reciprocation that varies along a direction transverse to the direction of reciprocation.

10. The deposition apparatus of claim 9 wherein the width in the direction of reciprocation varies linearly along the direction transverse to the direction of reciprocation.

11. The deposition apparatus of claim 9 wherein the shadow mask wafer includes or holds a plurality of shadow masks.

12. A deposition apparatus for depositing a stack of coating material layers of two or more different types onto an associated substrate, the deposition apparatus comprising:
 a substrate holder configured to hold the associated substrate;
 at least one deposition source arranged to emit a deposition beam onto the associated substrate held by the substrate holder;
 a shadow mask wafer interposed between the at least one deposition source and the substrate holder such that the deposition beam passes through the shadow mask wafer before impinging onto the associated substrate;
 a reciprocation mechanism configured to generate reciprocation between the shadow mask wafer and the substrate holder in a direction of reciprocation while the at least one deposition source emits the deposition beam to create the stack of coating material layers of two or more different types onto the associated substrate which forms a one-dimensionally varying optical filter, wherein the reciprocation mechanism includes:
 an actuator arm extending from the substrate holder and connecting with and reciprocating the shadow mask wafer; and
 a rotation mechanism that includes a shaft, wherein the rotation mechanism is configured to rotate the substrate holder and the shadow mask wafer together as a unit about the shaft as the reciprocation mechanism generates the reciprocation.

13. The deposition apparatus of claim 12 wherein one of:
 (i) the reciprocation mechanism is configured to generate reciprocation of the shadow mask wafer respective to the substrate holder, or
 (ii) the reciprocation mechanism is configured to generate reciprocation of the substrate holder respective to the shadow mask wafer.

14. The deposition apparatus of claim 12 wherein the reciprocation mechanism further comprises a support arm that supports an end of the shadow mask wafer distal from the shadow mask wafer connection with the actuator arm.

15. The deposition apparatus of claim 12 further comprising:
 a chamber containing the substrate holder, the shadow mask wafer, and the reciprocation mechanism and providing a controlled ambient composition and pressure.

16. The deposition apparatus of claim 12 wherein the at least one deposition source includes at least one thermal evaporation source comprising a resistive heater or an electron beam or at least one sputtering source.

17. The deposition apparatus of claim 12 wherein the shadow mask wafer includes or holds at least one shadow mask that has a plurality of openings, each opening having a width in the direction of reciprocation that varies along a direction transverse to the direction of reciprocation.

18. The deposition apparatus of claim 17 wherein the width in the direction of reciprocation varies linearly along the direction transverse to the direction of reciprocation.

19. The deposition apparatus of claim 12 wherein the at least one deposition source is located off-center.

\* \* \* \* \*